United States Patent
Hellberg et al.

(10) Patent No.: US 8,238,848 B2
(45) Date of Patent: Aug. 7, 2012

(54) FEED FORWARD NOISE REDUCTION IN A TRANSMITTER

(75) Inventors: Richard Hellberg, Huddinge (SE); Mats Klingberg, Enskede (SE); Joakim Plahn, Täby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 309 days.

(21) Appl. No.: 12/601,944

(22) PCT Filed: Jun. 20, 2007

(86) PCT No.: PCT/SE2007/050438
§ 371 (c)(1),
(2), (4) Date: Nov. 25, 2009

(87) PCT Pub. No.: WO2008/156395
PCT Pub. Date: Dec. 24, 2008

(65) Prior Publication Data
US 2010/0173596 A1   Jul. 8, 2010

(51) Int. Cl.
*H04B 1/04* (2006.01)
*H04K 3/00* (2006.01)
(52) U.S. Cl. .................................. 455/114.3; 375/296
(58) Field of Classification Search .... 455/114.1–114.3, 455/127.1; 333/100, 109–112; 375/296–297
See application file for complete search history.

(56) References Cited

U.S. PATENT DOCUMENTS

| 5,796,304 A | 8/1998 | Gentzler |
| 6,191,652 B1 | 2/2001 | Gentzler |
| 7,058,386 B2 | 6/2006 | McGregor et al. |
| 7,167,693 B2 * | 1/2007 | Bachman et al. ............ 455/127.1 |
| 2005/0200422 A1 * | 9/2005 | Shamsaifar et al. ......... 333/17.1 |

OTHER PUBLICATIONS

International Search Report for PCT/SE2007/050438, mailed Feb. 13, 2008.
Written Opinion of the International Searching Authority for PCT/SE2007/050438, mailed Feb. 13, 2008.
Shcherbelis, Y. et al., Electronic Letters, "Microwave feed-forward low noise amplifier design for cellular base station", vol. 37, No. 6, (Mar. 15, 2001), pp. 359-361.

* cited by examiner

*Primary Examiner* — Lee Nguyen
(74) *Attorney, Agent, or Firm* — Nixon & Vanderhye P.C.

(57) ABSTRACT

A circuit (200, 400, 500, 600, 700) for use in a transmitter in a base station in a wireless cellular access system, comprising a main line with a first filter (210) arranged in the main line with an input side (220) and an output side (230) in the main line. The circuit additionally comprises a feed forward cancellation loop with a second filter (240), the cancellation loop also having an input point (250) and an output point (260). The cancellation loop is connected to the main line with the output point (260) of the cancelation loop being connected to the main line on the output side (230) of the first filter (210). Suitably, the first filter (210) i.e. the main line filter, is a bandpass filter.

12 Claims, 8 Drawing Sheets

FEED FORWARD NOISE REDUCTION IN A TRANSMITTER

This application is the U.S. national phase of International Application No. PCT/SE20071050438, filed 20 Jun. 2007, which designated the U.S., the entire contents of which is hereby incorporated by reference.

TECHNICAL FIELD

The present invention discloses an improved circuit for feed forward noise reduction in a transmitter.

BACKGROUND

Transmitters in many radio-based telecommunications and broadcast systems must transmit wide bandwidth modulated signals without adding too much distortion or noise. Generally, components in the entire signal processing chain, from the digital forming of baseband signals through analogue mixers and amplifiers to the final power amplification stage, add noise and distortion to the signal.

Noise that is inside the bandwidth of interest, i.e. the carrier bandwidth or potential carrier bandwidth, is controlled by having sufficient numbers of bits in the digital signals, good precision in the digital to analogue converters, and low noise components in the analogue chain. Noise that is outside the bandwidth of the carrier is generally reduced by filtering. Filtering is generally less costly and has less impact on efficiency if it is performed early in the processing chain, while filtering after final power amplification is especially costly, since at this point any insertion loss of a filter will have maximum effect on the efficiency of the transmitter.

Non-linear distortion or intermodulation is relatively large where the signal is large and when high efficiency is desired. This usually means that the final amplification stages, and especially the power amplifier, will distort the signal the most. A general band-limited carrier signal, i.e. multicarrier, multiuser, or, in general, an amplitude modulated signal, that is non-linearly distorted has a wider bandwidth than the original signal due to distortion sidebands. These distortion sidebands reduce the performance of the system, and are thus limited by standards and regulations to be below some specified level.

In order to counteract distortion in the final amplification stage, the input signal to the power amplifier is often predistorted. The predistortion can take place at digital or analogue baseband, at an intermediate frequency, or at the final radio frequency. Predistortion generally increases the bandwidth of the signal, similarly to actual distortion. Due to this bandwidth increase, noise close to the signal that occurs after the predistortion stage can no longer be filtered out in the early stages of the processing chain, since this would mean that important components of the predistorted signal would also be filtered out and not reach the power amplifier.

Predistortion can effectively reduce the distortion inside and close to the carriers. To have a large distortion-free bandwidth, the bandwidth of the predistortion signal must generally also be large. This can be costly, so instead a filter is usually applied after the power amplifier, to reduce noise and distortion further away from the carriers. Since such a filter is harder to build and/or has larger loss if a narrower transition from pass- to stopband is required, a trade-off exists between the bandwidth of the predistortion circuitry and subsequent circuits, and the transition width of the filter.

In addition to the need for filtering to achieve a pure transmitted signal, many systems that utilize frequency division duplex, i.e. different frequencies for transmit and receive signals, have a limit on the amount of noise and distortion that may leak from the transmitter to the receiver of the same equipment.

This leakage may be high if the antennas for transmitter and receiver are close to each other, or if one and the same antenna is used for both transmit and receive, which is otherwise economical. The leakage can be counteracted either by applying more filtering in the transmit branch than would otherwise be required by the standard or regulations, or by additional filtering in the receive branch.

US patent application 2005/0200422 describes a traditional feedforward distortion cancelling system in which an additional loop, dedicated to receiver noise reduction, includes a tuneable delay line and possibly a filter.

U.S. Pat. No. 7,058,368 describes a traditional feedforward system for receiver (or general) noise cancellation, with a cancellation loop which includes a filter.

These prior art solutions may improve upon a solution that uses only filters, since filters that achieve high stopband rejection also have high insertion loss in the passband. A combination of filtering with one of the prior art feedforward solutions can thus have lower insertion loss than a standalone filter.

The solutions proposed by US patent application 2005/0200422 and U.S. Pat. No. 7,058,368 have established that feedforward noise reduction can be beneficial both for reducing noise leakage to the receive band when co-locating transmitters and receivers and for reducing the transmission of noise outside the carrier band.

However, the insertion loss and/or the power consumption will still be high with these systems, so that the total system efficiency will be low. In addition, the solutions proposed by both of these documents result in a circuit complexity which is also rather high.

SUMMARY

As shown above, there is a need for a solution by means of which noise in a transmitter, particularly in a base station a wireless cellular access system can be reduced in a better way than has been possible previously, with improvements (reductions) of insertion loss and power consumption, and with a rather low circuit complexity.

This need is addressed by a circuit for use in a transmitter in a base station in a wireless cellular access system. The circuit comprises a main line in which there is a first filter which is arranged in the main line so that the first filter has an input side and an output side in the main line.

In addition, the circuit comprises a feed forward cancellation loop which comprises a second filter, and the cancellation loop also has an input point and an output point. The cancellation loop is connected to the main line with the output point of the cancelation loop being connected to the main line on the output side of the first filter.

For example, the first filter, i.e. the main line filter, is a bandpass filter, and the second filter, i.e. the filter of the cancellation loop, is preferably a bandstop filter.

As will be explained in more detail in the following detailed description, a solution is obtained which offers improved noise reduction with lower inser6ytion loss than has previously been possible.

DETAILED DESCRIPTION

Figure 1:
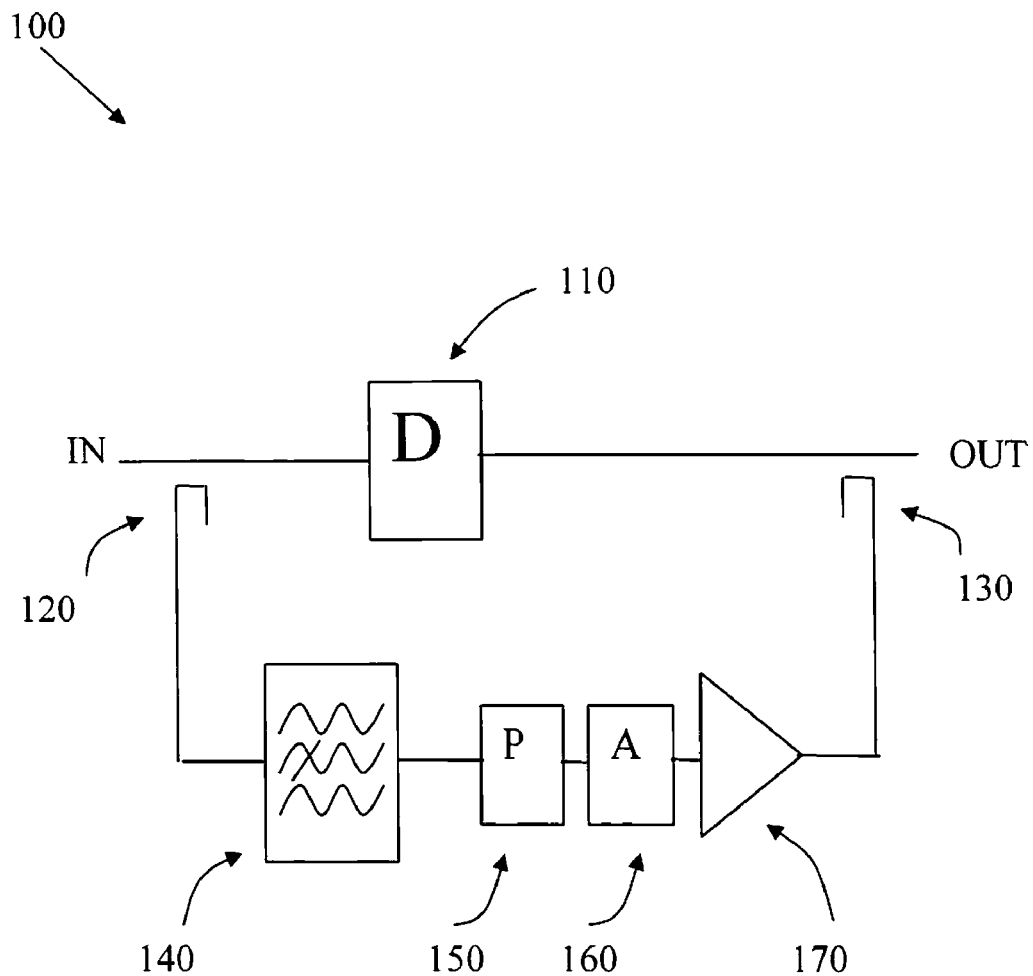
FIG. 1 shows a prior art noise cancellation circuit.

FIG. 1 shows a prior art solution 100 for noise reduction by means of a feed forward circuit. As can be seen, the circuit 100 comprises a main line and a feed forward loop, the feed forward loop being connected to the main line by means of a first directional coupler 120 at the input side of the cancelation loop, as well as by means of a second directional coupler 130 at the output side of the cancellation loop.

In the main line of the circuit 100, there is a delay component D 110, which delays the main line signal so that it is in phase with the cancellation loop signal at the output of the second directional coupler 130, where the cancellation loop joins the main line.

The prior art cancellation loop will typically comprise a filter 140, usually a bandstop filter, although for specific receiver band noise reduction the filter 140 can be a bandpass filter. The component P 150 is a phase adjuster, usually a variable delay line or phasing network-multiplier combination, component A 160 is an amplitude adjuster such as a variable gain amplifier or variable attenuator, and the component 170 is an amplifier that provides gain in order to compensate for the low coupling factor of the directional couplers 120, 130.

The transmitter in which the circuit 100 is employed will usually comprise a power amplifier, which is generally placed before the circuit 100, since the circuit 100 will then be able to reduce the power amplifier's signal distortion and noise.

After the "OUT" point of the circuit 100, i.e. the point where the cancelation loop joins the main line, there will usually be a filter, in order to reduce "out of band" noise and distortion.

A traditional feed forward solution such as the one shown in FIG. 1 has a rather low efficiency, mainly due to the fact that the cancellation loop signal is inserted into the main signal path at a point with a high signal level, which causes a high insertion loss in the directional couplers as well as a high power consumption in the cancellation loop's amplifier 170. This dependence arises since the insertion loss in the main paths of the directional couplers is directly related to the level of coupling to the coupled port. If the insertion loss in the main path is to be low, the coupling factors must consequently be low, and the amplifiers in the cancellation loop need to have high gain and high power, which increases loop delay and consumes power.

The technology described below improves traditional feedforward solutions such as the one shown in FIG. 1, particularly in applications where noise or distortion is to be reduced outside of a carrier signal, and where it is desired to reduce leakage between a transmitter and a receiver.

A feed forward noise cancellation loop is used, but the signal from the cancellation loop is inserted into the main line at a point after a filter in the main path. Since the main path filter will have lowered the noise and distortion level, the coupling factor and thus the insertion loss can be greatly reduced, as compared to known solutions, but the efficiency will still be retained, if not improved upon, since the necessary gain and power consumption in the cancellation loop is lowered.

The cancellation loop comprises a filter, complementary to the main path filter, for the coupling in or out of noise power, which will further reduce the insertion loss of the cancellation loop in the main path.

In one example embodiment, the cancellation loop filter itself is directly connected to the main line. In this case the cancellation loop filter must have a high impedance in the passband of the main path filter. The elimination of directional couplers will also reduce the insertion loss of the cancellation loop in the main path.

Due to the signal level reduction in the cancellation loop, the complementary filter can have a high impedance level, thus interacting with the main signal path even less. The high impedance level of the filter also reduces the Q-factor requirement in the coupling filter.

In this way, the need for amplification in the cancellation loop can be eliminated. On the contrary, if the stopband rejection in the main path filter is relatively high, attenuation will instead be required in the inventive cancellation loop, which is desirable in that it reduces the mutual interaction between the main path and cancellation path filters. In addition to attenuation, it is desired to obtain a frequency response in the cancellation loop that matches that of the corresponding frequency band in the main loop, since this will increase the effective cancellation bandwidth. Obtaining the correct frequency response is also made simpler, since a rather high attenuation can be accepted, as opposed to prior art solutions.

Figure 2:
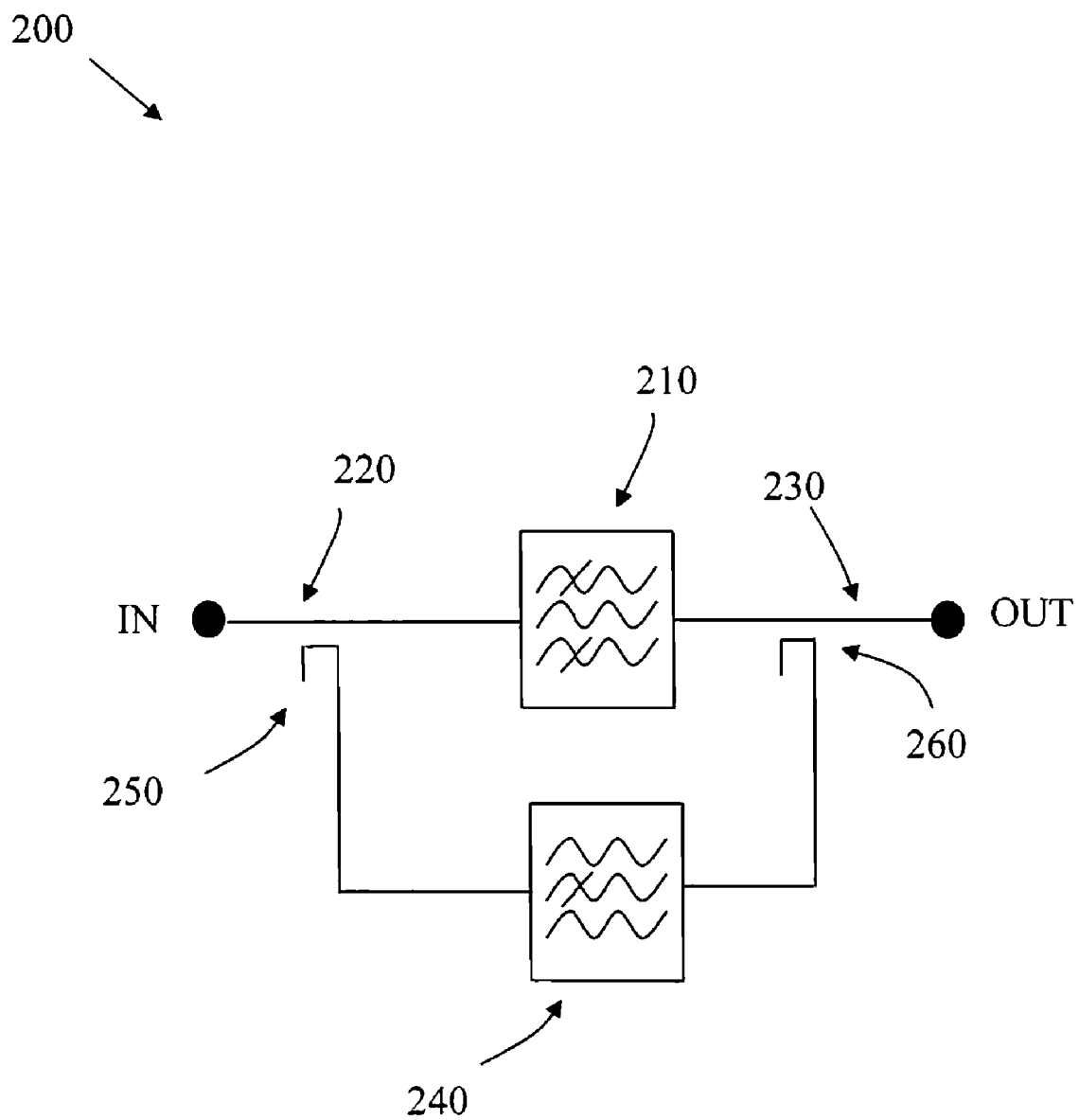
FIG. 2 shows a noise cancellation circuit.

FIG. 2 shows a first example embodiment 200. As can be seen, the design 200 comprises a main line in which there is a first filter 210, with an input side 220 and an output side 230 in the main line. The design 200 also comprises a cancellation loop in which there is a second filter 240, and the cancellation loop has an input point 250 and an output point 260, which connect the loop to the main line. As shown in FIG. 2, the cancellation loop is suitably connected at its input and output points to the main line by means of directional couplers 250, 260, although the connection of the cancellation loop to the mainline may also be done in other ways, as will be elaborated upon later in this text.

As indicated in FIG. 2, the first filter 210, i.e. the main line filter, is suitably a bandpass filter, although this should merely be seen as an example of a filter type. As is also exemplified in FIG. 2, the second filter, i.e. the filter 240 of the cancellation loop may be a bandstop filter, with its stopband in the carrier band, i.e. in the band of the signal which it is intended to transmit by the transmitter in which the circuit 200 is a part.

The sum of the coupling factors and amplifier gain of the cancellation loop can then be reduced by the same amount as the main path filter's 210 stopband attenuation, which can, as shown in FIG. 2, mean that the need for an amplifier in the cancellation loop can be entirely eliminated. In addition, the insertion loss of the cancellation loop of the circuit 200 of FIG. 2 will be greatly reduced as compared to prior art.

It should be mentioned, however, that the cancellation loop filter 240 can also be a bandpass filter dedicated to one of the noise and distortion sidebands, or a multiple bandpass filter, for example one that has a passband above the carrier band and one below it. In another embodiment, several individual cancellation loops with one band pass filter each (as well as electrical length, gain and other parameters) may be used instead of multiple filters in one cancellation loop.

Figure 3:
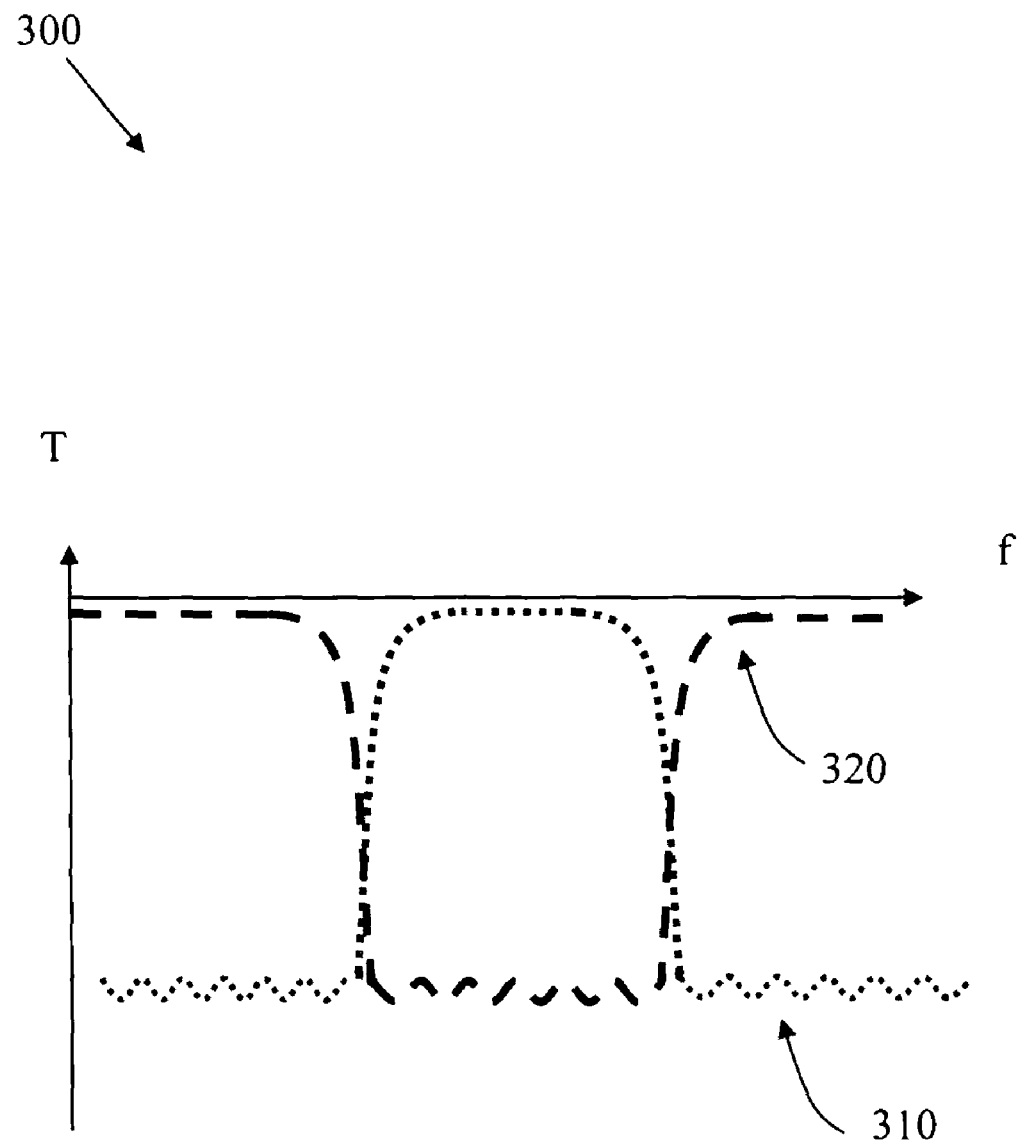
FIG. 3 shows frequency responses of the circuit of FIG. 2, and FIGS. 4-7 show various non-limiting example embodiments.

FIG. 3 shows a schematic diagram 300 of transmission as a function of frequency for the filters 210 (bandpass) and 240 (bandstop) of FIG. 2, with the first filter 210 shown by means of a dotted line 310 and the second filter 240 shown by means of a dashed line 320.

The difference between the stopband attenuation of the main path filter and the insertion loss in the cancellation path filter, i.e. transmission responses relative to 0 dB (the X-axis of FIG. 3), is the amount of attenuation that must be provided by directional couplers or other means, as will be elaborated upon below.

Figure 4:
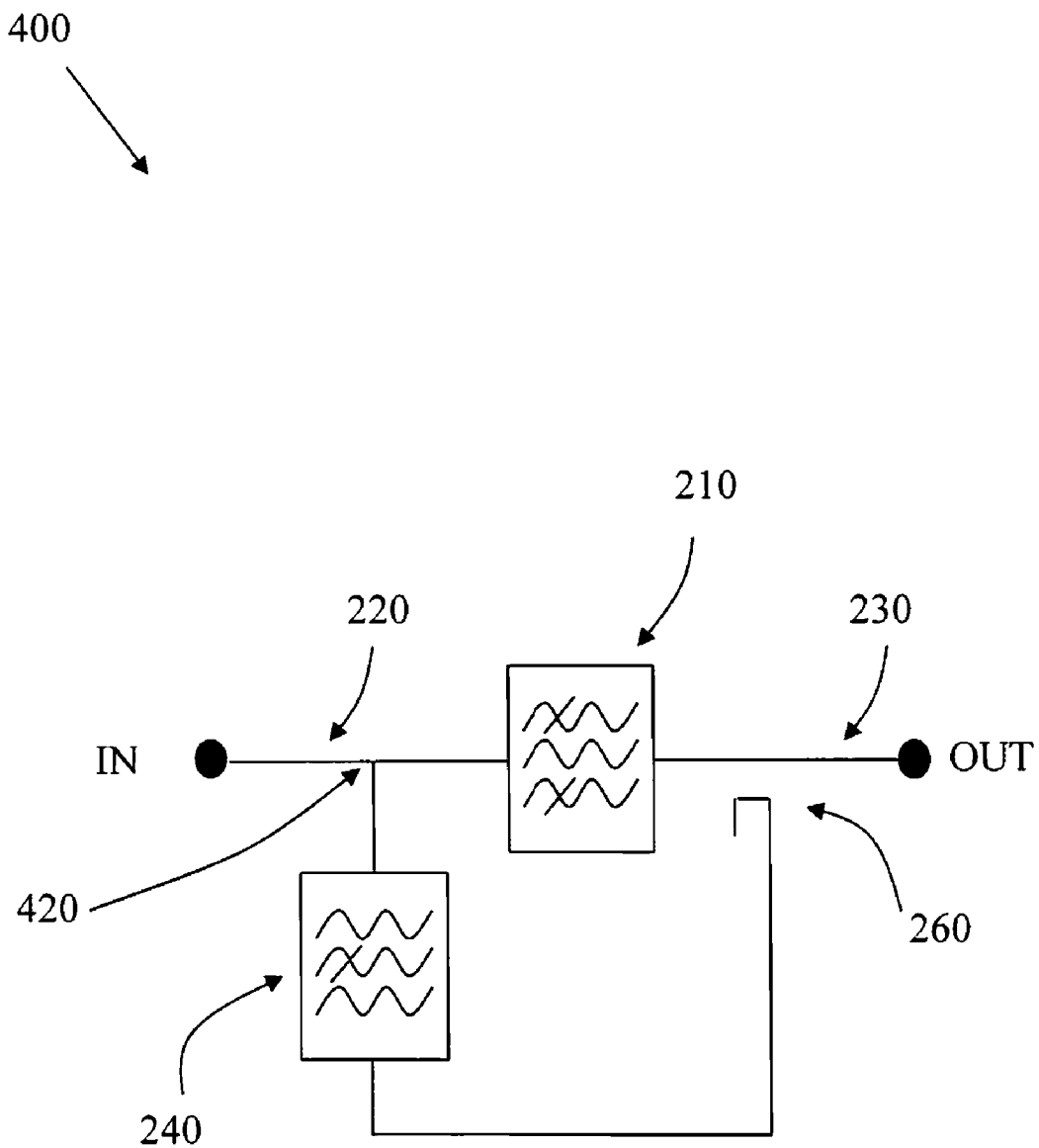

FIG. 4 shows a second example embodiment 400. Components which have already been described in connection to FIG. 2 have retained their reference numbers in FIG. 4, as well as in the following FIGS. 5-8.

As can be seen from FIG. 4, the embodiment 400 only utilizes one directional coupler 260 n order to connect the cancellation loop to the main line, which is done at the output side 230 of the first filter 210. On the input side 220 of the first filter 210, the cancellation loop is connected directly, i.e. by means of a galvanic connection 420. Because of this way of connecting the cancellation loop at the input side of the first filter, the second filter, i.e. the filter 240 in the cancellation loop must now also show a high impedance in the carrier band (the passband of the main path filter) at the connection point 420, in order not to interact too much with the main path filter 210.

The necessary extra attenuation in the cancellation loop may, in this embodiment, come only from the coupling factor of the directional coupler 260 at the output side of the main line filter 210. Since the coupling factor has been lowered due to the use of only one directional coupler the insertion loss in the main path caused by the cancellation loop is greatly reduced.

Figure 5:
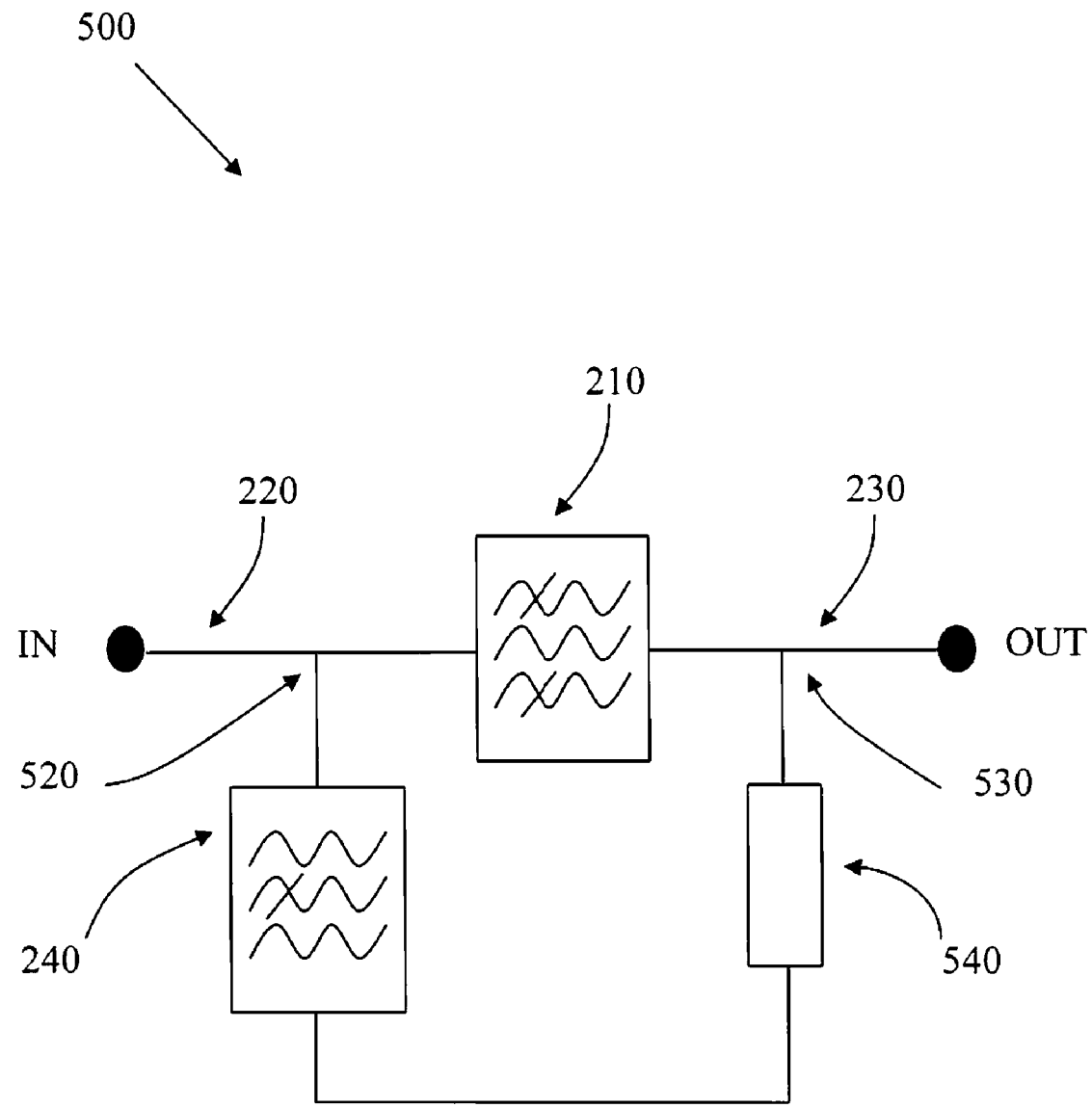

FIG. 5 shows a third example embodiment 500. As can be seen in FIG. 5, in the embodiment 500 the cancellation loop is connected to the main line without the use of directional couplers, with the cancellation loop being connected to the input side 220 of the main line filter 210 in the same manner as in the embodiment 400 at a point 520, and through a resistance 540 at a point 530 on the output side 230 of the mainline filter 210.

The necessary attenuation is, in this embodiment, obtained by means of the resistive coupler 540. Since the attenuation is high, isolation can be high and thus, the insertion loss of the circuit 500 will be low.

Figure 6:
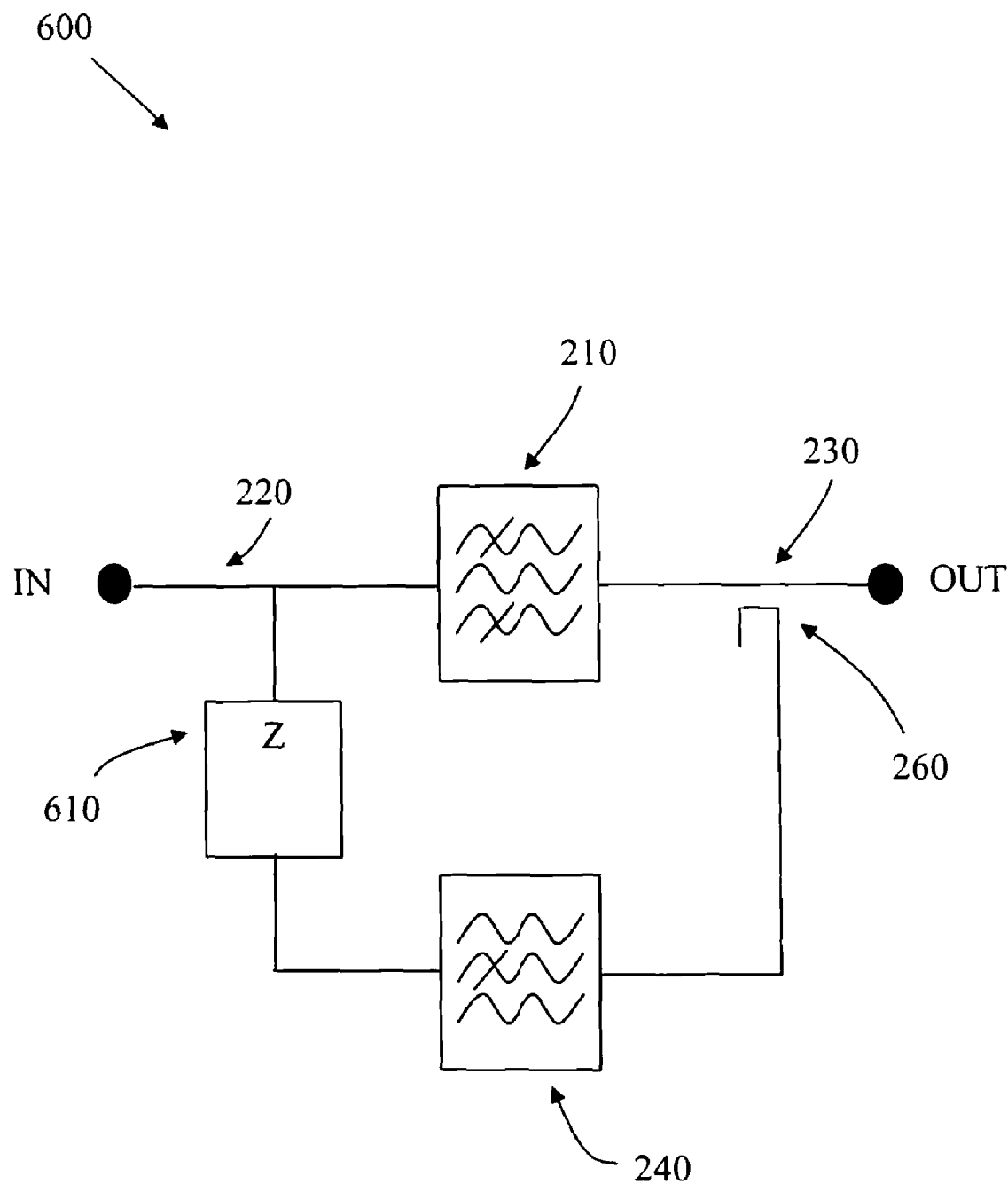

FIG. 6 shows yet another example embodiment 600. It may be desired to keep the influence of the cancellation loop filter on the main path low, especially regarding losses that "steal" power from the main line, which can be achieved by transforming and/or inverting the cancellation loop filter's stopband impedance to high impedance, as shown in the embodiment of FIG. 6. This enables the use of smaller and less expensive filters, whose losses would otherwise be too detrimental to the insertion loss of the main path. Thus, the embodiment 600 of FIG. 6 is similar to the one in FIG. 5, with the exception of an impedance transforming and/or inverting network "Z" 610, by means of which the input side of the cancellation loop is connected to the input side of the mainline filter 210.

If the filter 240 of the cancellation loop already has high impedance in its stopband, i.e. the passband of the main line filter, the impedance transformer 610 may be used to increases this impedance even more. In this way, the resistive part of the impedance of the filter 240 will influence the main line even less.

If the cancellation path filter instead has a low stopband impedance, the impedance transformation feature of the component "Z" 610 can be combined with impedance inversion. The coupling of the cancellation signal to the cancellation loop is lowered by the impedance transformation (due to increased mismatch), but this can in most cases partly or fully, easily and advantageously, be incorporated into the already necessary attenuation. Impedance inversion of the stopband impedance may be easily performed by a quarter wavelength transmission line, or by an equivalent circuit.

The a priori matching of the cancellation path to the main path is thus simplified, and the stability of the match is also improved, due to the removal of the high gain amplifier chain of prior art. By removing this amplifier chain of the prior art solutions, it has become possible to reduce the cancellation loop's electrical length, and the matching of paths only involves passive circuits. Both of these factors may reduce production spread, as well as causing a reduced drift in the gain and phase of the cancellation loop.

However, if an even more increased level of matching is desired, this may be offered by the use of circuits for adjusting such parameters as, for example, gain/attenuation, phase and/or delay. Such an example embodiment 700 is shown in FIG. 7.

Figure 7:
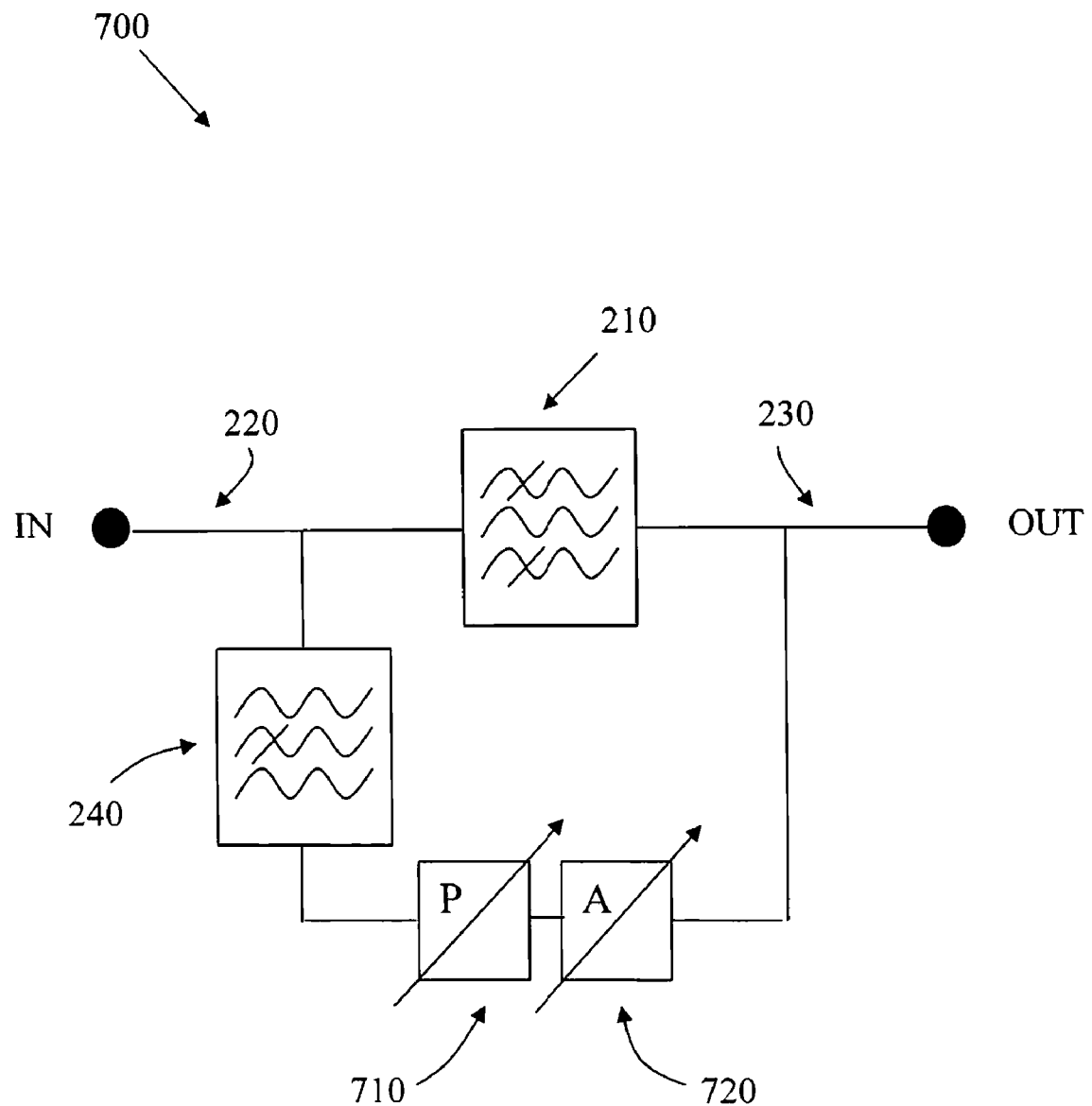

The embodiment 700 includes a resistive coupling network 720, which in FIG. 7 is shown as a variable attenuator, and the embodiment 700 also includes a variable phase adjuster 710, coupled in series with the variable attenuator 720. In the cancellation loop of the embodiment 700, the filter 240 of the cancellation loop is attached directly to the mainline, at the input side of the filter 210 of the main line, and coupled in series with the variable phase adjuster 710 and the variable attenuator 720, which is attached directly to the main line, on the output side of the filter 210 of the main line.

Figure 8:
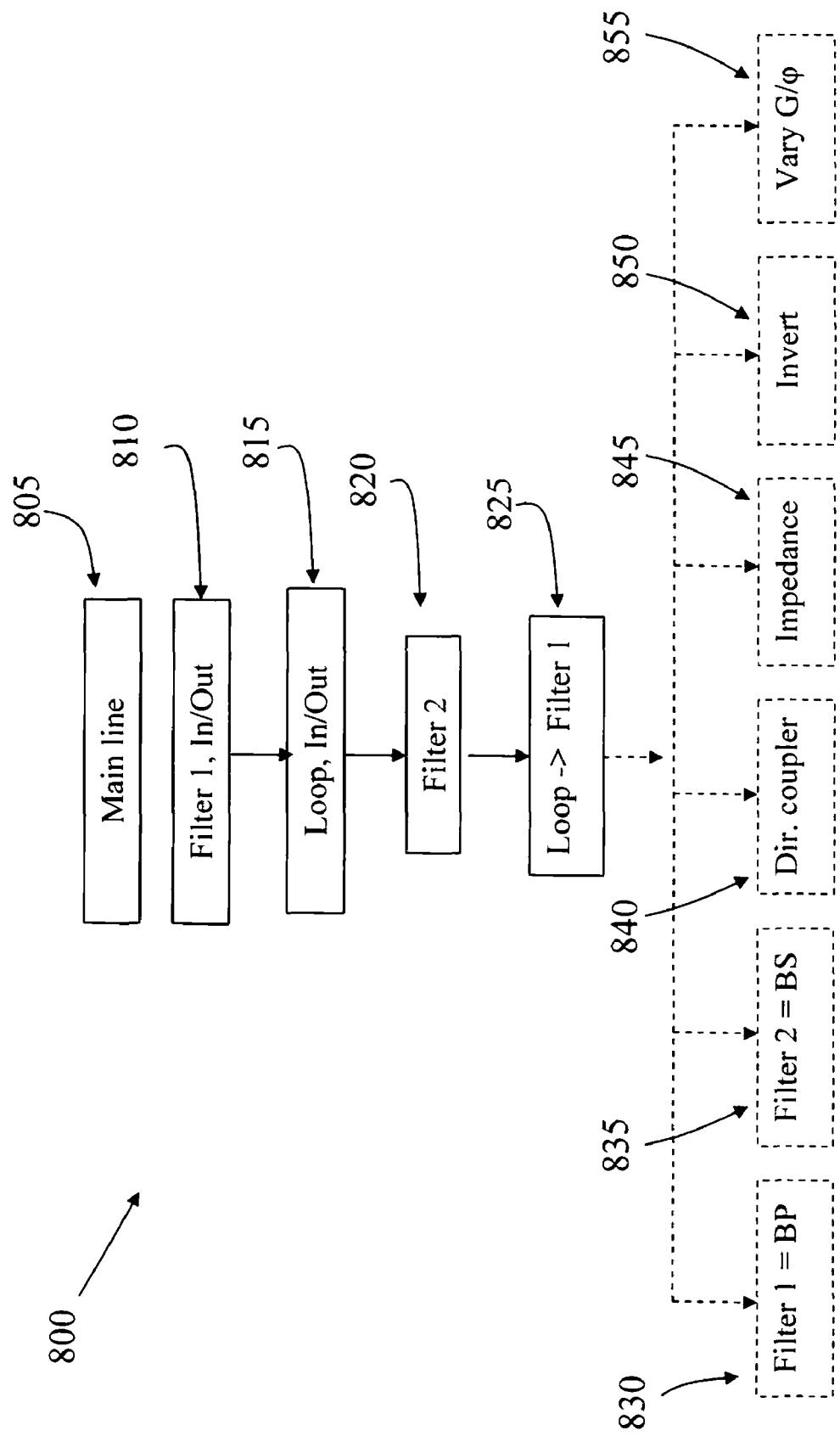
FIG. 8 shows a flowchart of a non-limiting example method.

The technology described is also directed towards an example method for use in a circuit in a transmitter in a base station in a wireless cellular access system. FIG. 8 shows a schematic flowchart of such a method 800. Steps which are options or alternatives are shown with dashed lines.

As indicated in step 805, the example method comprises arranging a main line in the circuit, and arranging, step 810, in the main line a first filter so that said first filter has an input side and an output side in the main line.

The method additionally comprises, as indicated in steps 815 and 820, equipping the circuit with a feed forward cancellation loop with a second filter, and arranging the cancellation loop to also have an input point and an output point.

Step 825 indicates that the method comprises connecting the cancellation loop to the main line with the output point of the cancelation loop connected to the main line on the output side of the first filter.

As indicated in step 830, the method may additionally comprise letting the first filter of the circuit be a bandpass filter, and as shown in step 835, the method may also comprise letting the second filter, i.e. the filter of the cancellation loop, be a bandstop filter.

As shown in step 840, at least one of the input and output points of the cancellation loop may be connected to the main line via a directional coupler, and as shown in step 845, at least one of the input and output points of the cancellation loop may be connected to the main line via an impedance. In other embodiments, the impedance may be replaced by or complemented with a transmission line, a direct coupling, a resistance, a resistive coupler, a capacitance or an inductance.

Step 850 shows that according to the example method, the cancellation loop may be equipped with a circuit for impedance inversion, or, as indicated in step 855, with a circuit for adjustable gain and/or phase variation.

The claims are not limited to the examples of embodiments described above and shown in the drawings, but may be freely varied within the scope of the appended claims. For example, in some embodiments, the main line may additionally comprise a delay component arranged to match the phase of the signal in the main line to the phase of the signal in the cancellation loop.

It should also be pointed out that in some embodiments of the invention, in the circuit of the invention, the main line may additionally comprise a delay component. Suitably, said delay component is arranged to match the phase of the signal in the main line to the phase of the signal in the cancellation loop.

The invention claimed is:

1. A circuit for use in a transmitter in a base station in a wireless cellular access system, the circuit comprising a main line which comprises a first filter which is arranged in the main line with an input side and an output side in the main line, the circuit additionally comprising a feed forward cancellation loop which comprises a second filter, said cancellation loop also having an input point and an output point, the circuit being characterized in that the cancellation loop is connected to the main line with the output point of the cancellation loop being connected to the main line on the output side of the first filter.

2. The circuit of claim 1, in which the first filter is a bandpass filter.

3. The circuit of claim 1, in which the second filter is a bandpass filter.

4. The circuit of claim 1, in which the second filter is a bandstop filter.

5. The circuit of claim 1, in which at least one of the input and output points of the cancellation loop is connected to the main line via a directional coupler.

6. The circuit of claim 1, in which at least one of the input and output points of the cancellation loop is connected to the main line via at least one of the following: an impedance, a transmission line, a direct coupling, a resistance, a resistive coupler, a capacitance, or an inductance.

7. The circuit of claim 1, in which the cancellation loop comprises a circuit for impedance transformation.

8. The circuit of claim 1, in which the cancellation loop comprises a circuit for impedance inversion.

9. The circuit of claim 1, in which the cancellation loop comprises a circuit for adjustable gain and/or phase variation.

10. The circuit of claim 1, in which the main line additionally comprises a delay component.

11. The circuit of claim 10, in which said delay component is arranged to match the phase of the signal in the main line to the phase of the signal in the cancellation loop.

12. A method for use in a circuit in a transmitter in a base station in a wireless cellular access system, the method comprising arranging in the circuit a main line, and arranging in said main line a first filter so that said first filter has an input side and an output side in the main line, the method additionally comprising equipping the circuit with a feed forward cancellation loop with a second filter, and arranging the cancellation loop to also have an input point and an output point, the method being characterized in that it comprises connecting the cancellation loop to the main line with the output point of the cancellation loop connected to the main line on the output side of the first filter.

* * * * *